United States Patent
Seo et al.

(10) Patent No.: US 6,683,014 B2
(45) Date of Patent: Jan. 27, 2004

(54) PIEZOELECTRIC CERAMIC COMPOSITION AND PIEZOELECTRIC CERAMIC DEVICE USING THE SAME

(75) Inventors: Dong Hwan Seo, Suwon (KR); Kang Heon Hur, Suwon (KR); Jong Kuk Hong, Choongchungnam-do (KR); Sang Koo Kwon, Suwon (KR)

(73) Assignee: S-Cera Co., Ltd., Kyunggi-do (KR)

( * ) Notice: Subject to any disclaimer, the term of this patent is extended or adjusted under 35 U.S.C. 154(b) by 0 days.

(21) Appl. No.: 10/206,983

(22) Filed: Jul. 30, 2002

(65) Prior Publication Data

US 2003/0125190 A1 Jul. 3, 2003

(30) Foreign Application Priority Data

Dec. 27, 2001 (KR) ......................... 2001-85732

(51) Int. Cl.$^7$ ........................... H01L 41/18; C04B 35/46
(52) U.S. Cl. ................................. 501/134; 252/42.9 R
(58) Field of Search ...................... 501/134; 252/62.9 R

(56) References Cited

FOREIGN PATENT DOCUMENTS

| JP | 7-206517 | 8/1995 |
|---|---|---|
| KR | 1999-88562 | 12/1999 |

*Primary Examiner*—C. Melissa Koslow
(74) *Attorney, Agent, or Firm*—Lowe Hauptman Gilman & Berner LLP

(57) ABSTRACT

The present invention provides a piezoelectric ceramic composition having the formula: $\{[Pb_{(1-1.5x)\pm(0\sim0.2)}La_x][Ti_{(1-y-z)}Mn_yCu_z]O_3\}$ which meets the requirements: $0.02<x<0.14$, $0.01\leq y<0.04$, and $0.002\leq z\leq 0.008$.

The piezoelectric ceramic composition of the present invention can be stably sintered under normal atmosphere. That is, there is no need for an oxygen partial pressure to be 80% or more. Furthermore, the composition exhibits excellent piezoelectric property and thermal stability. Accordingly, the piezoelectric ceramic composition of the present invention has excellent piezoelectric property at a thickness longitudinal third harmonic frequency capable of producing a high frequency of 15 MHz or more, and can be used as a material of a piezoelectric ceramic device with a small electrode area.

2 Claims, No Drawings

PIEZOELECTRIC CERAMIC COMPOSITION AND PIEZOELECTRIC CERAMIC DEVICE USING THE SAME

BACKGROUND OF THE INVENTION

1. Field of the Invention

The present invention relates to a piezoelectric ceramic composition, and more particularly, to a piezoelectric ceramic composition having improved heat resistance and piezoelectric property by replacing conventional piezoelectric ceramic components with other components, and a piezoelectric ceramic device using the same.

2. Description of the Related Art

As a result of recent developments in the information industry, almost all appliances and devices such as Hard Disc Drive (HDD), Hand-Held Phone (HHP), Compact Disc Read Only Memory (CD-ROM), CD-Recordable & Writeable (CD-RW), Digital Versatile Disc (DVD), DVD-Recordable & Writeable (DVD-RW), wireless keyboard, optical mouse or the like are provided with a SMD-type resonator producing a clock frequency, as essential parts in the digital era. Keeping pace with the performance enhancement and miniaturization trends of digital products, the resonator continues to advance toward higher frequencies and a small, light and power-efficiency. In order to manufacture more and more miniaturized resonators using a higher frequency, a piezoelectric ceramic composition having excellent piezoelectric property and thermal stability is required.

A $Pb(Zr,Ti)O_3$- and a $PbTiO_3$-based piezoelectric ceramic composition have been mainly used in recent years. A thickness vibration mode is a representative vibration mode in these piezoelectric ceramic compositions. The thickness vibration mode uses energy trap vibration and is divided into a fundamental vibration mode and a higher order vibration mode.

As for the $Pb(Zr,Ti)O_3$-based composition, contrary to a fundamental vibration mode, piezoelectric property is relatively poor in a higher order vibration mode. For the higher order vibration mode, furthermore, because a resonance frequency constant is relatively small, there is a limitation in that it is difficult to obtain a high frequency. On the other hand, the $PbTiO_3$-based composition has such characteristics as a low dielectric constant, a small grain size and a high phase transition temperature. Furthermore, due to large lattice anisotropy in the C-axis direction, it is difficult to trap energy in a fundamental vibration mode, but it is easy to trap energy in a higher order vibration mode capable of producing a high frequency. In light of these facts, the $PbTiO_3$-based composition has superior piezoelectric property and thermal stability to the $Pb(Zr,Ti)O_3$-based composition. Accordingly, the former has been recognized as a material suitable for a high frequency band oscillator.

Nevertheless, because the $PbTiO_3$-based composition has large crystal anisotropy, there is a problem in that spontaneous phase transition stress during cooling readily causes cracks, resulting in a sintering property being poor. Recent studies have been proceeding actively with the aim of minimizing spontaneous phase transition stress during cooling and enhancing a sintering property by the substitution of A-site and/or B-site by other components or the use of other additives.

By way of a representative example, Japanese Patent Laid-Open Publication No. 7-206517 (publication date: Aug. 8, 1995, applicant: MATSUSHITA ELECTRIC IND CO LTD) discloses a piezoelectric ceramic composition comprising a $(Pb,La)TiO_3$-based main component and CuO, $ZrO_2$ and $MnO_2$ as additives. The piezoelectric ceramic composition presented in the above publication has a high usable frequency and a large D/R (dynamic ratio) during resonating. In spite of these advantages, the piezoelectric ceramic composition must be sintered in an atmosphere having an oxygen partial pressure of above 80%. The composition is used as a material of a piezoelectric ceramic device with a diameter of 15–18 mm; however, the composition cannot be used as a material of a latest piezoelectric ceramic device for driving a hard disc, which has an electrode area of 2.5 mm×2.0 mm and produces a frequency of 40 MHz or more. When the device is miniaturized, there are problems in that a D/R is reduced during resonating and a spurious phenomenon occurs in third harmonic frequency.

SUMMARY OF THE INVENTION

Therefore, the present invention has been made in view of the above problems, and it is an object of the present invention to provide a piezoelectric ceramic composition, which is used as a material of a piezoelectric ceramic device with an electrode area as small as 2.5 mm×2.0 mm or less.

It is another object of the present invention to provide a piezoelectric ceramic composition, which can be sintered under normal atmosphere.

It is a further object of the present invention to provide a piezoelectric ceramic composition, which has excellent electric property (D/R=above 60) and thermal property under reflow at about 250° C. or more.

It is another object of the present invention to provide a piezoelectric ceramic composition, which exhibits excellent piezoelectric property at a thickness longitudinal vibration third harmonic frequency.

It is yet another object of the present invention to provide a miniaturized piezoelectric ceramic device, which produces a high frequency and is able to be mounted in a surface mount manner at a high temperature.

In accordance with the present invention, the above and other objects can be accomplished by the provision of a piezoelectric ceramic composition represented by the general formula (1) below, which comprises essentially Pb, La, Ti, Mn and Cu:

$$\{[Pb_{(1-1.5x)\pm(0-0.2)}La_x][Ti_{(1-y-z)}Mn_yCu_z]O_3\} \qquad \text{Formula (1)}$$

(wherein, $0.02 < x < 0.14$, $0.01 \leq y < 0.04$, and $0.002 \leq z \leq 0.008$.)

In accordance with another aspect of the present invention, there is provided a miniaturized piezoelectric ceramic device, which produces a high frequency and is able to be mounted in a surface mount manner at a high temperature.

DESCRIPTION OF THE PREFERRED EMBODIMENTS

A piezoelectric composition of the present invention is expressed by the general formula, $[Pb_{(1-1.5x)\pm(0-0.2)}La_x][Ti_{(1-y-z)}Mn_yCu_z]O_3$. The composition is an $ABO_3$ composite perovskite composition, the A-site consisting of PbO and $La_2O_3$, and the B-site consisting of $TiO_2$, $MnO_2$ and CuO. Contrary to a conventional composition, manganese (Mn) and copper (Cu) are not additives, but are substituted for titanium (Ti) as a matrix composition. As a result, charge neutrality of grains and grain boundaries, along with crystal structure and chemical stability, may be more stably adjusted.

In the above formula, lanthanum (La), an A-site component, is required to meet $0.02 < x < 0.14$. If the x value is more than 0.014, cavities are formed in some sites occupied by Pb and thus charge neutrality is maintained. As a result, diffusion of atoms occurs to reduce internal stress due to crystal anisotropy during sintering and to prevent the formation of cracks. However, if the x value is below 0.02, such effects are not sufficiently realized, and if it exceeds 0.14, oscillation stability and thermal stability are poor.

In the above formula, Mn and Cu, B-site components, present in a small amount, serve to enhance electrical properties and thermal stability of a piezoelectric ceramic composition. Mn is required to meet $0.01 \leq y < 0.04$. If the y value is more than 0.04, because Mn acts as an electron acceptor, there are problems in that the insulation property of a sintered body is low and an amount of leakage current increases rapidly, thereby preventing polarization or lowering piezoelectric property. Cu is required to meet $0.002 \leq z \leq 0.008$. Within the above range, cavities are provided, so as to lower resonance resistance and thus control an amount of leakage current. If the z value is outside the range, piezoelectric property is low and thermal stability is poor.

The piezoelectric ceramic composition of the present invention is excellent in sintering property and thus is able to be stably sintered even under normal atmosphere. Accordingly, there is no need for the composition to be sintered under an atmosphere with controlled oxygen partial pressure. Furthermore, it has excellent electric property under reflow above 250° C. and has excellent thermal stability even after reflow. Accordingly, it exhibits excellent piezoelectric property at a thickness longitudinal vibration third harmonic frequency capable of producing a high frequency. Also, the use of the composition makes it possible to manufacture a piezoelectric ceramic device having an electrode area of 2.5 mm×2.0 mm or less.

To accomplish an excellent reflow property, reflow must be carried out at about 240–250° C., and to maintain polarity and a large D/R value, a $T_c$ value must be above 295° C. Also, if a value of D/R is lower than 60, an amount of battery wastage, i.e., an energy loss is large. Accordingly, it is preferred that a $T_c$ value is not only above 295° C. but also a D/R value is above 60.

EXAMPLE

Hereinafter, The following will specifically describe examples according to the present invention with reference to Table 1 below.

The compositions shown in Table 1 were prepared using PbO, $La_2O_3$, $TiO_2$, $MnO_2$ and CuO as starting materials. PbO, $La_2O_3$, $TiO_2$, $MnO_2$ and CuO each were weighted and mixed with a ball mill. The well-mixed slurry was dried to form a powder with a grain size of 0.1–1.5 μm. Care was taken not to separate layers during drying. If layer separation occurs, a perovskite crystal forms two phases, not a single phase, which may be fatal to piezoelectric property. If the mean grain size of the powder is outside the above range, energy suitable for the formation of a single phase cannot be provided, whereby a second phase is formed or raw material powder remains.

Then, the powder was calcined at 650–1,000° C. for 1–4 hours. However, if a single phase is not formed, a second stage calcination method can be employed. The calcined powder was mixed with a small amount of a binder and the resultant was wet-crushed to a powder with a mean grain size of 0.1–1.2 μm. Then, the powder was sintered under an atmosphere at a sintering temperature of 1,000–1,350° C. for 1–4 hours to obtain a sintered body in the form of a plate of 23 mm×18 mm. The obtained sintered body was first polished on both surfaces to a thickness of 0.5 mm, and then processed into a piezoelectric ceramic, of which surface toughness is excellent, having a thickness longitudinal vibration third harmonic frequency mode of 20 MHz–60 MHz. Then, electrodes with a diameter of 0.5–1.5 mm are formed on both surfaces of the obtained piezoelectric ceramic to manufacture a piezoelectric ceramic sample. The sample was subject to an electric field of 3–10 kVmm in a silicon oil at 100–250° C. for 10–30 minutes, thereby polarizing the sample.

Each sample was measured for the following parameters: resonance frequency ($F_r$), antiresonance frequency ($F_a$), resonance resistance ($Z_r$) and antiresonance resistance ($Z_a$); wherein all tests employed at a resonance frequency of a thickness longitudinal vibration third harmonic frequency, with an impedance analyzer (product: HP4194A).

In the present experiments, the measurements for D/R (dynamic ratio), coefficient of resonance frequency (TCF), phase transition temperature ($T_c$) and the variation in oscillation frequency after reflow at the phase transition temperature ($\Delta F_{osc}$) were obtained, rather than those for a dielectric constant, an electromechanical coupling coefficient ($k_t$), and a mechanical quality factor ($Q_m$). The D/R is a factor determining an output level during operation of an oscillating circuit of a practical oscillator, and a TCF is essential for oscillation stability.

The D/R value is a factor determining an output level represented by the following equation. In the examples, the D/R value was measured on I.R.E. standard circuit using a thickness longitudinal vibration third harmonic frequency mode.

The temperature coefficient of resonance frequency (TCF) was calculated from the resonance frequency ($F_r$) measured at—40° C.–90° C. using the following equation:

$$D/R = 20 \log \frac{Z_{a\,max}}{F_{r(90° C.) \& min} F_{r(-40° C.)}}$$
$$TCF(ppm/° C.) = \frac{}{130 F_{r(25° C.)}}$$

Piezoelectric ceramic samples each with a different composition, along with their piezoelectric properties and thermal properties obtained from aforementioned tests, are shown in Table 1.

TABLE 1

| | $[Pb_{(1-1.5x)+(0-0.2)}La_x][Ti_{(1-y-z)}Mn_yCu_z]O_3$ | | | D/R | TCF | $T_c$ | $\Delta F_{osc}$ | |
|---|---|---|---|---|---|---|---|---|
| Sample | X | y | z | (dB) | (ppm/° C.) | (° C.) | (%) | Note |
| 1* | 0 | 0 | 0 | | | | | Unsinterable |
| 2* | 0 | 0.01 | 0 | | | | | Unsinterable |
| 3* | 0 | 0.1 | 0.01 | | | | | Unsinterable |
| 4* | 0.01 | 0.01 | 0.002 | 27 | 12 | 390 | 0.01 | |
| 5* | 0.02 | 0.1 | 0.011 | 51 | 15 | 354 | 0.02 | |

TABLE 1-continued

| | $[Pb_{(1-1.5x)\pm(0-0.2)}La_x][Ti_{(1-y-z)}Mn_yCu_z]O_3$ | | | D/R | TCF | $T_c$ | $\Delta F_{osc}$ | |
|---|---|---|---|---|---|---|---|---|
| Sample | X | y | Z | (dB) | (ppm/°C.) | (°C.) | (%) | Note |
| 6* | 0.02 | 0.01 | 0.002 | 50 | 13 | 350 | 0.02 | |
| 7 | 0.03 | 0.01 | 0.003 | 61 | 14 | 349 | 0.01 | |
| 8 | 0.07 | 0.02 | 0.005 | 63 | 17 | 345 | 0.01 | |
| 9* | 0.07 | 0.04 | 0.011 | 55 | 28 | 342 | 0.07 | |
| 10* | 0.07 | 0.001 | 0.1 | 25 | 25 | 345 | 0.09 | |
| 11 | 0.11 | 0.01 | 0.002 | 60 | 26 | 300 | 0.07 | |
| 12 | 0.11 | 0.02 | 0.005 | 66 | 32 | 300 | 0.11 | |
| 13 | 0.11 | 0.03 | 0.08 | 72 | 30 | 295 | 0.13 | |
| 14* | 0.11 | 0.04 | 0.01 | 53 | 30 | 290 | 0.14 | |
| 15* | 0.11 | 0.1 | 0.015 | 48 | 33 | 291 | 0.45 | |
| 16 | 0.13 | 0.01 | 0.006 | 60 | 31 | 296 | 0.15 | |
| 17* | 0.14 | 0.01 | 0.002 | 53 | 36 | 270 | 1.45 | |
| 18* | 0.14 | 0.02 | 0.005 | 63 | 42 | 264 | 1.38 | |
| 19* | 0.14 | 0.03 | 0.008 | 56 | 40 | 260 | 1.34 | |
| 20* | 0.14 | 0.04 | 0.01 | 50 | 40 | 260 | 0.9 | |
| 21* | 0.14 | 0.06 | 0.02 | 48 | 43 | 257 | 1.0 | |
| 22* | 0.14 | 0.08 | 0.10 | 44 | 52 | 251 | 0.8 | |
| 23* | 0.16 | 0.01 | 0.002 | 60 | 46 | 255 | 2.16 | |
| 24* | 0.18 | 0.06 | 0.015 | 48 | 48 | 241 | 0.9 | |
| 25* | 0.20 | 0.08 | 0.10 | 54 | 52 | 240 | 0.9 | |
| 26* | 0.20 | 0.01 | 0.002 | 60 | 56 | 227 | 0.7 | |
| 27* | 0.20 | 0.02 | 0.005 | 60 | 52 | 226 | 0.9 | |
| 28* | 0.20 | 0.04 | 0.008 | 58 | 50 | 224 | 0.8 | |
| 29* | 0.20 | 0.06 | 0.015 | 53 | 50 | 223 | 0.8 | |
| 30* | 0.20 | 0.08 | 0.015 | 48 | 53 | 221 | 0.7 | |
| 31* | 0.20 | 0.10 | 0.10 | 51 | 58 | 220 | 0.9 | |

(The comparative examples are marked with asterisk (*).)

As can be seen from the Table 1, provided that $0.02<x<0.14$, $0.01 \leq y<0.04$, and $0.002 \leq z \leq 0.008$, the piezoelectric ceramic composition of the present invention can be sintered at normal atmosphere and can be used as a material of a piezoelectric ceramic device with an electrode area as small as 2.5 mm×2.0 mm. Also, under the prescribed range of x, y and z, D/R value is maintained to be above 60 dB and the phase transition temperature ($T_c$) in each composition is above 295° C. In addition to the above, the composition exhibits such characteristics that the variation in oscillation frequency ($\Delta F_{osc}$) after reflow at the phase transition temperature of each composition ($T_c$) is ±1% and a temperature coefficient of resonance frequency (TCF) is below 60 ppm/°C.

The piezoelectric ceramic composition can be stably sintered, and exhibits excellent piezoelectric property at a thickness longitudinal vibration third harmonic frequency capable of producing a high frequency of above 15 MHz.

Lanthanum is able to reduce internal stress and thus prevent the formation of cracks within the range of 2 to 14 mol %. If the content of lanthanum exceeds 2 mol %, sintering property is enhanced and a D/R value increases, while if it exceeds 14 mol %, a temperature coefficient of a resonance frequency (TCF) is outside the range of above 60 ppm/°C. and a phase transition temperature is also reduced.

The content of manganese is required to be 1 to 4 mol %. Within this range, a resonance resistance is low, ensuring improved piezoelectric property, and thermal resistance is enhanced, ensuring thermal stability. If Mn content is below 1 mol %, its effect is insignificant, and if it exceeds 4 mol %, an amount of leakage current increases rapidly due to an insulation resistance, thereby preventing the formation of polarization.

Copper, a component in the composition, is a tetravalent metal element. It provides cavities in a crystal structure, thereby lowering a resonance resistance and controlling an amount of leakage current. As its content increases, a temperature coefficient of resonance frequency tends to be reduced slightly. If the Cu content is below 0.2 mol %, its effect is insignificant, while, if the content exceeds 0.8 mol %, piezoelectric property is poor.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

As described above, the piezoelectric ceramic composition of the present invention can be stably sintered under normal atmosphere. That is, there is no need for an oxygen partial pressure to be 80% or more. Furthermore, the composition not only exhibits electric property as high as 60 dB or more under reflow at 250° C. or more, but also has excellent thermal stability. Excellent piezoelectric ceramic compositions can be obtained with a variation in oscillation frequency after reflow of ±1 and a temperature coefficient of resonance frequency of up to 30 ppm/°C.

Accordingly, the piezoelectric ceramic composition of the present invention has excellent piezoelectric property at a thickness longitudinal third harmonic frequency capable of producing a high frequency of 15 MHz or more, and can be used as a material of a piezoelectric ceramic device with a small electrode area.

What is claimed is:

1. A piezoelectric ceramic composition having the formula (1):

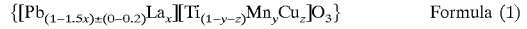
      $\{[Pb_{(1-1.5x)\pm(0-0.2)}La_x][Ti_{(1-y-z)}Mn_yCu_z]O_3\}$  Formula (1)

wherein, $0.02<x<0.14$, $0.01 \leq y<0.04$, and $0.002 \leq z \leq 0.008$.

2. A piezoelectric ceramic device essentially consisting of a piezoelectric ceramic composition having the formula (1):

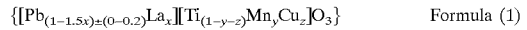
      $\{[Pb_{(1-1.5x)\pm(0-0.2)}La_x][Ti_{(1-y-z)}Mn_yCu_z]O_3\}$  Formula (1)

wherein, $0.02<x<0.14$, $0.01 \leq y<0.04$, and $0.002 \leq z \leq 0.008$.

* * * * *